(12) United States Patent
    Washizuka (10) Patent No.: US 11,821,058 B2
(45) Date of Patent: Nov. 21, 2023

(54) METHOD FOR PRODUCING INTERMETALLIC COMPOUND

(71) Applicant: Murata Manufacturing Co., Ltd., Nagaokakyo (JP)

(72) Inventor: Seitaro Washizuka, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 1694 days.

(21) Appl. No.: 15/438,942

(22) Filed: Feb. 22, 2017

(65) Prior Publication Data

US 2017/0159154 A1  Jun. 8, 2017

Related U.S. Application Data

(63) Continuation of application No. PCT/JP2015/072597, filed on Aug. 10, 2015.

(30) Foreign Application Priority Data

Sep. 10, 2014  (JP) ................. 2014-184052

(51) Int. Cl.
    *C22C 1/02*      (2006.01)
    *B23K 35/30*     (2006.01)
    (Continued)

(52) U.S. Cl.
    CPC ............ *C22C 1/02* (2013.01); *B23K 35/0244* (2013.01); *B23K 35/22* (2013.01); *B23K 35/26* (2013.01);
    (Continued)

(58) Field of Classification Search
    CPC .. C22C 1/02; C22C 1/00; C22C 13/00; B23K 35/0244; B23K 35/22; B23K 35/26;
    (Continued)

(56) References Cited

U.S. PATENT DOCUMENTS 9,044,816 B2    8/2015  Nakano et al.
9,105,987 B2 *  8/2015  Nakano .............. B23K 35/0244
    (Continued)

FOREIGN PATENT DOCUMENTS

JP      2013-080844 A    5/2013
WO   WO 2011/027659 A1   3/2011
WO   WO 2012/108395 A1   8/2012

OTHER PUBLICATIONS

International Search Report issued in International Application No. PCT/JP2015/072597, dated Oct. 27, 2015.
(Continued)

*Primary Examiner* — Kevin E Yoon
*Assistant Examiner* — Ryan L Heckman
(74) *Attorney, Agent, or Firm* — ArentFox Schiff LLP (57) ABSTRACT

A metal paste that includes a metal component and a flux. The metal component includes a first metal powder and a second metal powder. The first metal powder is Sn. The second metal powder is a CuNi alloy. The metal paste is heated for a time t1 to a temperature T1 where the first metal powder is melted. Next, the metal paste is heated for a time t2 longer than the time t1 at a temperature T2 lower than the temperature T1 to produce an intermetallic compound from the first metal Sn and the second metal CuNi alloy.

10 Claims, 6 Drawing Sheets

(51) Int. Cl.
  *B23K 35/22* (2006.01)
  *B23K 35/26* (2006.01)
  *C22C 1/00* (2023.01)
  *B23K 35/02* (2006.01)
  *H05K 3/34* (2006.01)
  *C22C 13/00* (2006.01)

(52) U.S. Cl.
  CPC ............ *B23K 35/262* (2013.01); *B23K 35/30* (2013.01); *B23K 35/302* (2013.01); *B23K 35/3033* (2013.01); *C22C 1/00* (2013.01); *C22C 13/00* (2013.01); *H05K 3/3485* (2020.08); *H05K 3/3494* (2013.01)

(58) Field of Classification Search
  CPC .... B23K 35/262; B23K 35/30; B23K 35/302; B23K 35/3033; H05K 3/3484; H05K 3/3494
  See application file for complete search history.

(56) References Cited

U.S. PATENT DOCUMENTS

| | | |
|---|---|---|
| 2004/0099714 A1 | 5/2004 | Strusinski et al. |
| 2010/0266870 A1* | 10/2010 | Nishimura ........... B23K 35/262 428/646 |
| 2012/0156512 A1 | 6/2012 | Nakano et al. |
| 2013/0088839 A1* | 4/2013 | Yamakami ............... H05K 3/00 361/728 |
| 2013/0270001 A1 | 10/2013 | Nakano et al. |
| 2014/0177132 A1* | 6/2014 | McConnell .......... H01G 9/0029 361/305 |
| 2015/0239089 A1 | 8/2015 | Nakano et al. |
| 2016/0035690 A1* | 2/2016 | Kido ..................... H01L 24/29 428/686 |

OTHER PUBLICATIONS

Written Opinion of the International Searching Authority issued in International Application No. PCT/JP2015/072597, dated Oct. 27, 2015.

* cited by examiner

METHOD FOR PRODUCING INTERMETALLIC COMPOUND

CROSS REFERENCE TO RELATED APPLICATIONS

The present application is a continuation of International application No. PCT/JP2015/072597, filed Aug. 10, 2015, which claims priority to Japanese Patent Application No. 2014-184052, filed Sep. 10, 2014, the entire contents of each of which are incorporated herein by reference.

FIELD OF THE INVENTION

The present invention relates to a method for producing an intermetallic compound that is produced by heating a mixture including a first metal and a second metal.

BACKGROUND OF THE INVENTION

Conventionally, methods for producing intermetallic compounds are known, which include heating a mixture including a first metal and a second metal that can react with the first metal to produce an intermetallic compound. For example, Patent Document 1 discloses a bonded structure and a bonding method with an intermetallic compound produced by heating a solder paste (mixture). The solder paste includes a metal component including a Sn powder and a CuNi alloy powder, and a flux component including a rosin and an activator.

Figure 6:
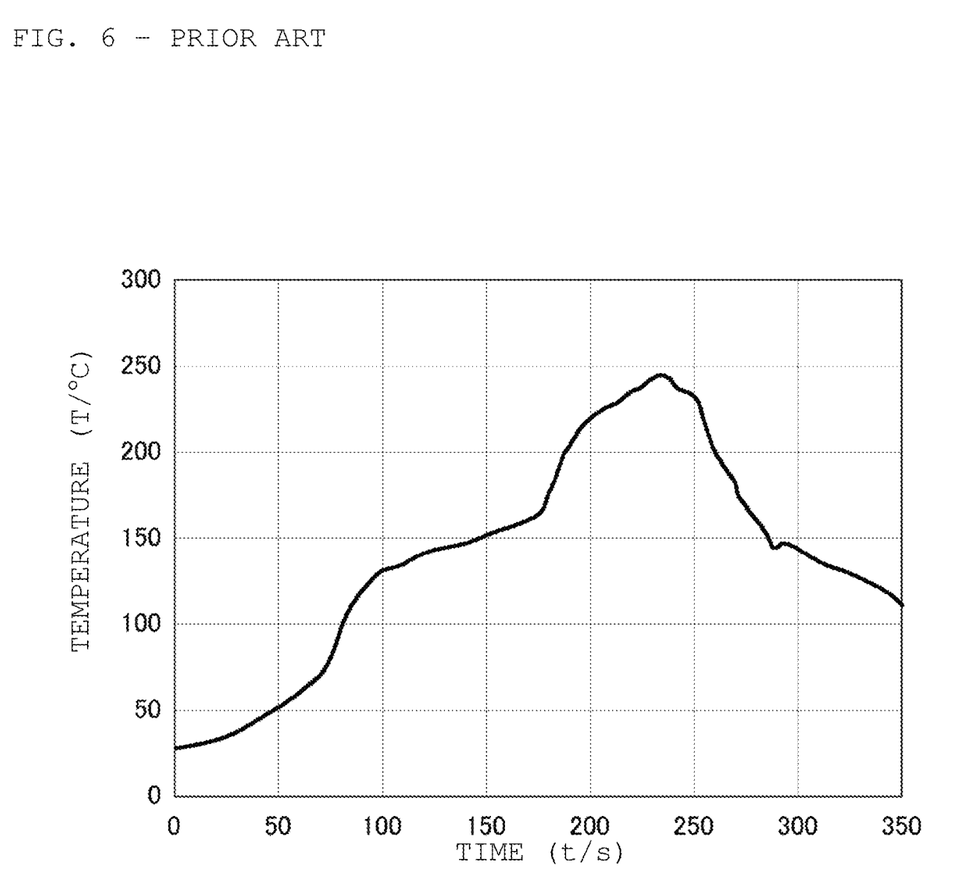
FIG. 6 is a diagram showing a temperature profile for reflow carried out in a bonding method in Patent Document 1.

The bonding method in Patent Document 1 provides the solder paste on lands provided on a printed wiring board, mounts a multilayer ceramic capacitor over the lands with the solder paste interposed therebetween, and applies heating with the use of a reflow device in accordance with the temperature profile shown in FIG. 6. In accordance with the temperature profile shown in FIG. 6, main heating is carried out at a temperature equal to or higher than the melting point (231.9° C.) of the Sn powder after preheating for a long period of time at a temperature equal to or lower than the melting point of the Sn powder.

The Sn powder and CuNi alloy powder included in the solder paste on heating produce a CuNiSn based intermetallic compounds with liquid-phase diffusion bonding (hereinafter, "TLP bonding: Transient Liquid Phase Diffusion Bonding").

Thus, the bonding member containing the intermetallic compound as its main phase bonds the lands provided on the printed wiring board and external electrodes provided for the multilayer ceramic capacitor. The CuNiSn based intermetallic compound has a high melting point (for example, 400° C. or higher).

As just described, the solder paste including the Sn powder and the CuNi alloy powder is turned into the bonding member containing the highly heat-resistant intermetallic compound as its main phase, with the TLP bonding.
Patent Document 1: WO 2011/027659

SUMMARY OF THE INVENTION

However, when the solder paste in Patent Document 1 is heated for a long period of time as shown in FIG. 6, the flux component in the solder paste is thermally decomposed, thereby generating a large amount of gas. As a result, a large volume of voids (air bubbles) is likely to be generated in the bonding member containing the intermetallic compound as its main phase, and there is thus a tendency to decrease the bonding strength. In addition, in the formation of the intermetallic compound, imbalances in interdiffusion between the Sn and the CuNi alloy may cause voids near the intermetallic compound.

On the other hand, when the time for heating the solder paste is short, the reaction for the production of the intermetallic compound tends to proceed insufficiently, thereby leaving a large amount of low heat-resistance unreacted Sn.

An object of the present invention is to provide a method for producing an intermetallic compound, which can produce a dense and highly heat-resistant intermetallic compound.

A method for producing an intermetallic compound according to the present invention includes a first heating step and a second heating step.

The first heating step heats a mixture including a first metal powder and a second metal powder that can react with the first metal to produce an intermetallic compound for a time t1 to a temperature T1 equal to or higher than the melting point of the first metal, thereby melting the first metal powder.

The second heating step heats the mixture with the first metal powder melted by the first heating step for a longer time t2 than the time t1 at a lower temperature T2 than the temperature T1, thereby accelerating a reaction between the first metal and the second metal for producing an intermetallic compound.

In this production method, the first metal is, for example, Sn. The Sn is preferably a pure metal, but may be a metal containing Sn as its main constituent. The second metal is, for example, a CuNi alloy. The intermetallic compound is, for example, an alloy containing at least two selected from the group consisting of Cu, Ni, and Sn. When the first metal is Sn, whereas the second metal is a CuNi alloy, the temperature T1 preferably falls within the range of 250° C. or higher and 300° C. or lower. When the second metal is a CuNi alloy, the temperature T2 preferably falls within the range of 180° C. or higher and 230° C. or lower. In addition, the time t1 preferably falls within the range of 60 seconds or longer and shorter than 120 seconds, whereas the time t2 preferably falls within the range of 120 seconds or longer and shorter than 400 seconds.

In accordance with this production method, the first heating step achieves heating at once in a short period of time to a temperature equal to or higher than the melting point of the first metal, thereby melting the first metal, and spreading out the melted material of the first metal around the second metal powder. Thereafter, the second heating step accelerates the reaction for the production of an intermetallic compound between the first metal and the second metal at the lower temperature for a long period of time.

The gas generation from the flux component is likely to be caused at high temperatures of 240° C. or higher, and the gas generation is thus caused mainly in the first heating step. In this regard, most of the Sn is melted and flowable, and it is thus possible to discharge the gas from the bonding member.

Furthermore, in the second heating step, because of the low-temperature heating, the intermetallic compound can be produced while suppressing the gas generation from the flux component. In addition, the mild alloying reaction can reduce the void generation associated with the formation of the intermetallic compound. Therefore, the intermetallic compound member produced by this production method has a dense structure with fewer voids.

In addition, this production method can reduce sites without contact between the first metal and the second metal, thus making it possible for the reaction for the production of the intermetallic compound to proceed sufficiently, and as a result, there is almost no low heat-resistance unreacted first metal left.

Therefore, according to this production method, a dense and highly heat-resistant intermetallic compound can be produced.

In addition, the mixture preferably further includes a flux component including a rosin and an activator.

In this production method, the flux component serves the function of removing oxide films at the surfaces of the objects to be bonded and metal powders.

According to the present invention, a dense and highly heat-resistant intermetallic compound can be produced.

DETAILED DESCRIPTION OF THE INVENTION

A method for producing an intermetallic compound according to an embodiment of the present invention will be described below.

Figure 1A:
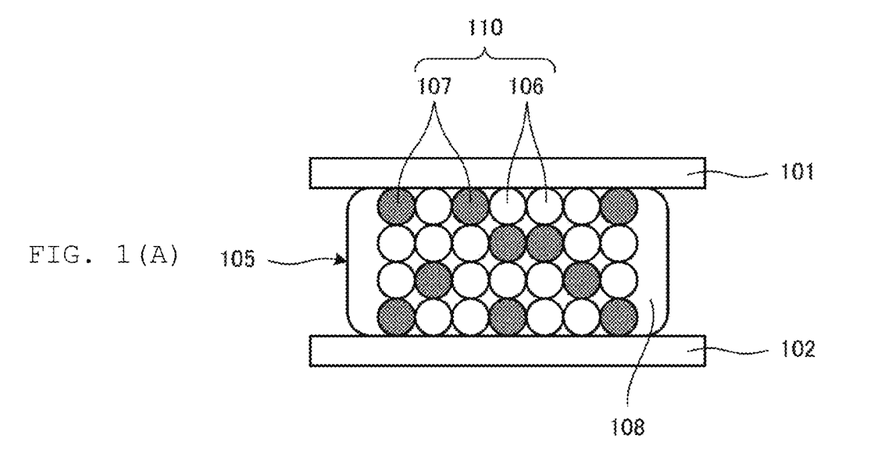
FIGS. 1(A) TO 1(C) are cross-sectional views schematically illustrating a process for producing an intermetallic compound that is produced by a method for producing an intermetallic compound according to an embodiment of the present invention.
Figure 1B:
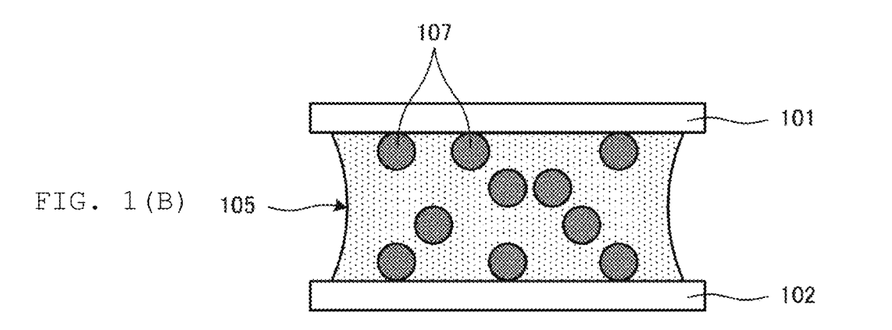
Figure 1C:
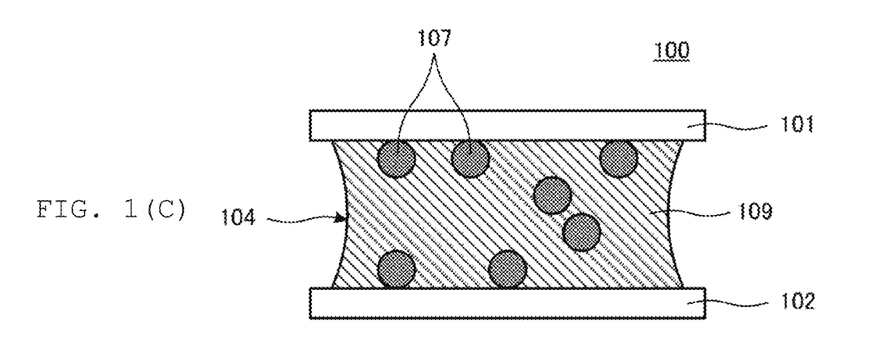
Figure 2:
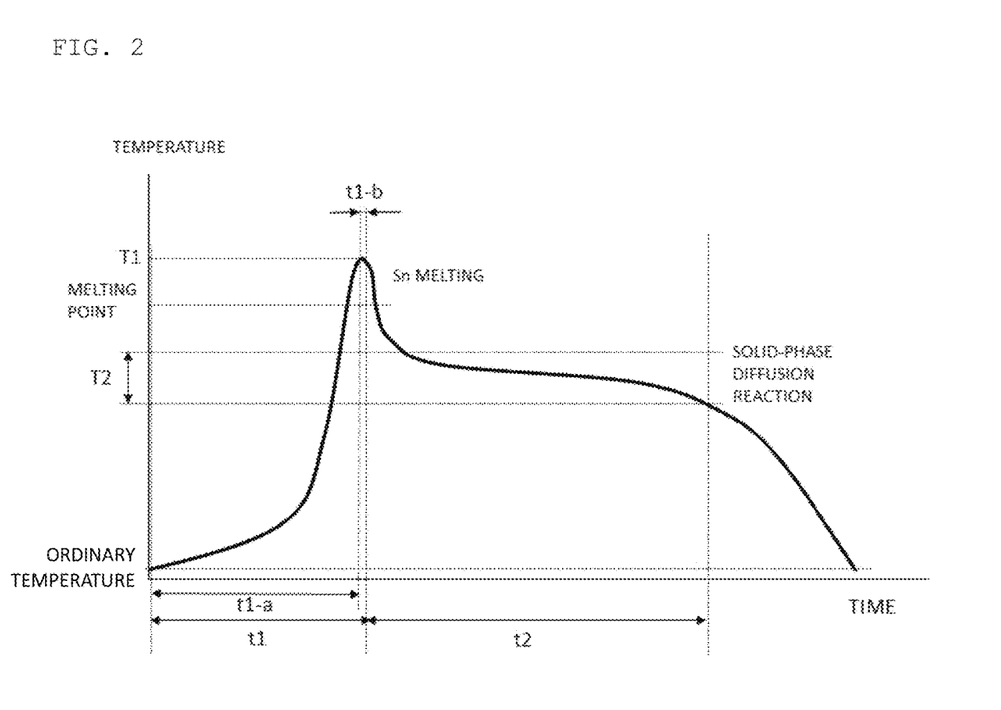
FIG. 2 is a diagram showing a temperature profile for a heating step carried out in a method for producing an intermetallic compound according to an embodiment of the present invention.

FIGS. 1(A) TO 1(C) are cross-sectional views schematically illustrating a process for producing an intermetallic compound that is produced by a method for producing an intermetallic compound according to the embodiment of the present invention. FIG. 2 is a diagram showing a temperature profile for a heating step carried out in a method for producing an intermetallic compound according to the embodiment of the present invention.

First, a metal paste 105 is prepared. The metal paste 105 is, as shown in FIG. 1(A), used for, for example, bonding a first object 101 to be bonded and a second object 102 to be bonded. In this regard, the metal paste 105 corresponds to the mixture according to the present invention.

The first object 101 to be bonded is a pipe, a nut, and an electronic component such as a multilayer ceramic capacitor, for example. The second object 102 to be bonded is, for example, a repairing sheet attached to a pipe, a bolt fitted into a nut, and a printed wiring board mounted with an electronic component.

The metal paste 105 includes a metal component 110 and a flux 108. The metal component 110 is uniformly dispersed in the flux 108. The metal component 110 is composed of a first metal powder 106 of a Sn-based metal; and a second metal powder 107 of a Cu-based metal that has a higher melting point than the Sn-based metal.

A material for the first metal powder 106 is Sn.

A material for the second metal powder 107 can react with the first metal powder 106 melted by heating the metal paste 105, thereby producing an intermetallic compound. The material for the second metal powder 107 is a CuNi alloy in the present embodiment. In addition, the intermetallic compound is an alloy containing at least two selected from the group consisting of Cu, Ni, and Sn. The intermetallic compound is, for example, a CuNiSn alloy. The intermetallic compound produced by the reaction between Sn and a CuNi alloy is, for example, $(Cu,Ni)_6Sn_5$, $Cu_4Ni_2Sn_5$, $Cu_5NiSn_5$, $(Cu,Ni)_3Sn$, $Cu_2NiSn$, $CuNi_2Sn$, or the like.

Next, the flux 108 includes a rosin, a solvent, a thixotropic agent, and an activator. The flux 108 serves the function of removing oxide films at the surfaces of the objects to be bonded and metal powders.

The rosin is, for example, a rosin-based resin composed of a modified rosin obtained by modifying a rosin and a derivative of a rosin or the like, a synthetic resin composed of a derivative of the resin, or a mixed product thereof.

The solvent is, for example, an alcohol, a ketone, an ester, an ether, an aromatic, or a hydrocarbon.

The thixotropic agent is, for example, a hydrogenated castor oil, a carnauba wax, an amide, a hydroxy fatty acid, a dibenzylidenesorbitol, a bis(p-methylbenezylidene)sorbitol, a beeswax, a stearic acid, or a hydroxy stearic acid ethylene bisamide.

In addition, the activator is, for example, a hydrohalogenic acid salt of an amine, an organic halogen compound, an organic acid, an organic amine, or a polyalcohol.

Next, in order to obtain a bonded structure 100 shown in FIG. 1(C), the metal paste 105 is provided between the first object 101 to be bonded and the second object 102 to be bonded as shown in FIG. 1(A).

Next, the metal paste 105 at ordinary temperature shown in FIG. 1(A) is heated with the use of, for example, a reflow device in accordance with the temperature profile shown in FIG. 2.

When the heating causes the metal paste 105 to reach a temperature T1, the first metal powder 106 is melted as shown in FIG. 1(B). The temperature T1 is a peak temperature equal to or higher than the melting point (231.9° C.) of the first metal Sn. The solvent and the like included in the flux 108 evaporate during the passage of the time t1 from the start of the heating.

It is to be noted that the temperature T1 is preferably a temperature of, for example, 250° C. or higher and 300° C. or lower as will hereinafter be described in detail. In addition, the time t1 is preferably a period of time, for example, 60 seconds or longer and shorter than 120 seconds. The time t1-a refers to a period of time from when the heating is started till when the temperature of a bonded part of a sample reaches the temperature T1. The temperature may be kept at the temperature T1 for a heating time of t1-b after reaching the temperature T1, but in this case, the time t1 is the total time of the time t1-a and the time t1-b.

Next, the metal paste 105 in the condition shown in FIG. 1(B) is, as shown in FIG. 2, heated for a longer time t2 than the time t1 at a lower temperature T2 than the temperature T1. Thus, a reaction for the production of an intermetallic compound is accelerated between the first metal Sn and the second metal CuNi alloy. This production reaction is a solid-phase diffusion reaction.

This intermetallic compound is, as described previously, an alloy containing at least two selected from the group consisting of Cu, Ni, and Sn. The intermetallic compound is, for example, a CuNiSn alloy. The intermetallic compound produced by the reaction between Sn and a CuNi alloy is, for example, $(Cu,Ni)_6Sn_5$, $Cu_4Ni_2Sn_5$, $Cu_5NiSn_5$, $(Cu,Ni)_3Sn$, $Cu_2NiSn$, $CuNi_2Sn$, or the like. The melting point of the intermetallic compound is 300° C. or higher, further 400° C. or higher.

It is to be noted that the temperature T2 is preferably set to fall within a temperature range that develops the previously described solid-phase diffusion reaction, as will hereinafter be described in detail. The temperature T2 is a temperature, for example, 180° C. or higher and 230° C. or lower. In addition, the time t2 is a period of time, for example, 120 seconds or longer and shorter than 400 seconds. The time t2 refers to a period of time from the start of a fall in temperature T1 to the temperature T2 or lower.

As just described, the diffusion reaction proceeds at a relatively low temperature in the metal paste 105, and the first metal Sn and second metal CuNi alloy included in the metal paste 105 turn into an intermetallic compound. Thus, the metal paste 105 turns into an intermetallic compound member 104. In FIG. 1(C), an intermetallic compound phase 109 of the intermetallic compound is shown.

Next, as shown in FIG. 2, the reflow device stops the heating after the time t2. Therefore, the intermetallic compound member 104 is naturally cooled to ordinary temperature (for example, 20° C.)

As a result, the bonded structure 100 is obtained where the intermetallic compound member 104 bonds the first object 101 to be bonded and the second object 102 to be bonded. The metallic compound has a high melting point (for example, 400° C.). Therefore, the intermetallic compound member 104 has high heat resistance.

In this regard, in accordance with the temperature profile shown in FIG. 2, the main heating is carried out without carrying out preheating for a long period of time at a temperature equal to or lower than the melting point of Sn as shown in FIG. 6. More specifically, in accordance with the production method according to the present embodiment, heating at once in a short period of time to a temperature equal to or higher than the melting point of Sn to melt the first metal Sn, and spreads out the melted material to the second metal CuNi alloy, and the reaction for the production of an intermetallic compound between the first metal Sn and the second metal CuNi alloy is then accelerated at the lower temperature for a long period of time.

Therefore, the production method according to the present embodiment can inhibit the generation of gas by the flux component 108, and inhibit the generation of voids (air bubbles) in the intermetallic compound member 104. Therefore, the intermetallic compound member 104 produced by the production method according to the present embodiment has a dense structure with fewer voids. As a result, for example, the bonding strength is increased between the first object 101 to be bonded and the second object 102 to be bonded which are bonded by the intermetallic compound member 104.

In addition, in accordance with the production method according to the present embodiment, the reaction for the production of the intermetallic compound proceeds sufficiently, thus leaving almost no low heat-resistance unreacted Sn.

Accordingly, the production method according to the present embodiment can produce dense and highly heat-resistant intermetallic compounds.

Next, an experimental example will be described in detail, in which multiple samples were prepared by varying the heating temperature and the heating time, and evaluated for void ratio and remaining component. Table 1 shows the results of evaluating the void ratio and the remaining component for each of the samples prepared by varying the heating temperature while making the heating time t1-a constant. In addition, Table 2 shows the results of evaluating the void ratio and the remaining component for each of the samples prepared by varying the heating time while making the heating temperature constant.

It is to be noted that the temperature T1, the temperature T2, the time t1, the time t1-a, the time t1-b, and the time t2 are respectively abbreviated as T1, T2, t1, t1-a, t1-b, and t2 in Tables 1 and 2. Samples 1 to 15 are intermetallic compound members produced by production methods according to the embodiment of the present invention. On the other hand, samples 51 to 57 are intermetallic compound members produced by production methods according to comparative examples for the embodiment of the present invention.

TABLE 1

| Sample Number | T1 [° C.] | T2 [° C.] | t1-a [sec] | t1-b [sec] | t1 (t1-a + t1-b) [sec] | t2 [sec] | Void Ratio Evaluation Void Ratio [%] | Determination | Remaining Component Evaluation Ratio of First Metal [%] | Determination | Comprehensive Evaluation |
|---|---|---|---|---|---|---|---|---|---|---|---|
| 1 | 260 | 180 | 90 | 0 | 90 | 210 | 5 | ⊙ | 19 | ○ | ○ |
| 2 | 260 | 200 | 90 | 0 | 90 | 210 | 4 | ⊙ | 11 | ○ | ○ |
| 3 | 260 | 210 | 90 | 0 | 90 | 210 | 4 | ⊙ | 5 | ⊙ | ⊙ |
| 4 | 260 | 220 | 90 | 0 | 90 | 210 | 11 | ○ | 4 | ⊙ | ○ |
| 5 | 260 | 230 | 90 | 0 | 90 | 210 | 12 | ○ | 2 | ⊙ | ○ |
| 6 | 250 | 200 | 90 | 0 | 90 | 210 | 5 | ⊙ | 12 | ○ | ○ |
| 7 | 280 | 200 | 90 | 0 | 90 | 210 | 6 | ⊙ | 5 | ⊙ | ⊙ |
| 8 | 300 | 200 | 90 | 0 | 90 | 210 | 8 | ⊙ | 4 | ⊙ | ⊙ |
| 51 | 240 | 180 | 90 | 0 | 90 | 210 | 11 | ○ | 88 | X | X |
| 52 | 240 | 240 | 90 | 210 | 300 | — | 8 | ⊙ | 80 | X | X |
| 53 | 260 | 160 | 90 | 0 | 90 | 210 | 4 | ⊙ | 78 | X | X |
| 54 | 260 | 260 | 90 | 210 | 300 | — | 61 | X | 0 | ⊙ | X |

TABLE 2

| Sample Number | T1 [° C.] | T2 [° C.] | t1-a [sec] | t1-b [sec] | t1 (t1-a + t1-b) [sec] | t2 [sec] | Void Ratio Evaluation | | Remaining Component Evaluation | | Comprehensive Evaluation |
|---|---|---|---|---|---|---|---|---|---|---|---|
| | | | | | | | Void Ratio [%] | Determination | Ratio of Remaining Component First Metal [%] | Determination | |
| 9  | 260 | 210 | 60 | 0  | 60  | 200 | 4  | ☉ | 18 | ○ | ○ |
| 10 | 260 | 210 | 90 | 0  | 90  | 120 | 4  | ☉ | 8  | ☉ | ☉ |
| 11 | 260 | 210 | 90 | 0  | 90  | 210 | 4  | ☉ | 5  | ☉ | ☉ |
| 12 | 260 | 210 | 90 | 0  | 90  | 300 | 5  | ☉ | 4  | ☉ | ☉ |
| 13 | 260 | 210 | 90 | 30 | 120 | 200 | 12 | ○ | 3  | ☉ | ○ |
| 14 | 260 | 210 | 90 | 30 | 120 | 400 | 13 | ○ | 2  | ☉ | ○ |
| 15 | 260 | 210 | 60 | 60 | 120 | 180 | 19 | ○ | 0  | ☉ | ○ |
| 55 | 260 | 210 | 60 | 0  | 60  | 60  | 4  | ☉ | 65 | X | X |
| 56 | 260 | 210 | 90 | 0  | 90  | 90  | 4  | ☉ | 25 | X | X |
| 57 | 260 | 210 | 90 | 90 | 180 | 60  | 35 | X | 0  | ☉ | X |

<<Metal Paste Composition>>

The metal paste was prepared by mixing 54 parts by weight of a Sn powder of 5 μm in average particle (D50), 36 parts by weight of a CuNi powder of 15 μm in average particle (D50), 4 parts by weight of a rosin, 2 parts by weight of an activator (adipic acid), and 4 parts by weight of an organic solvent (diethylene glycol monohexyl ether).

<<Sample Preparation>>

Figure 3:
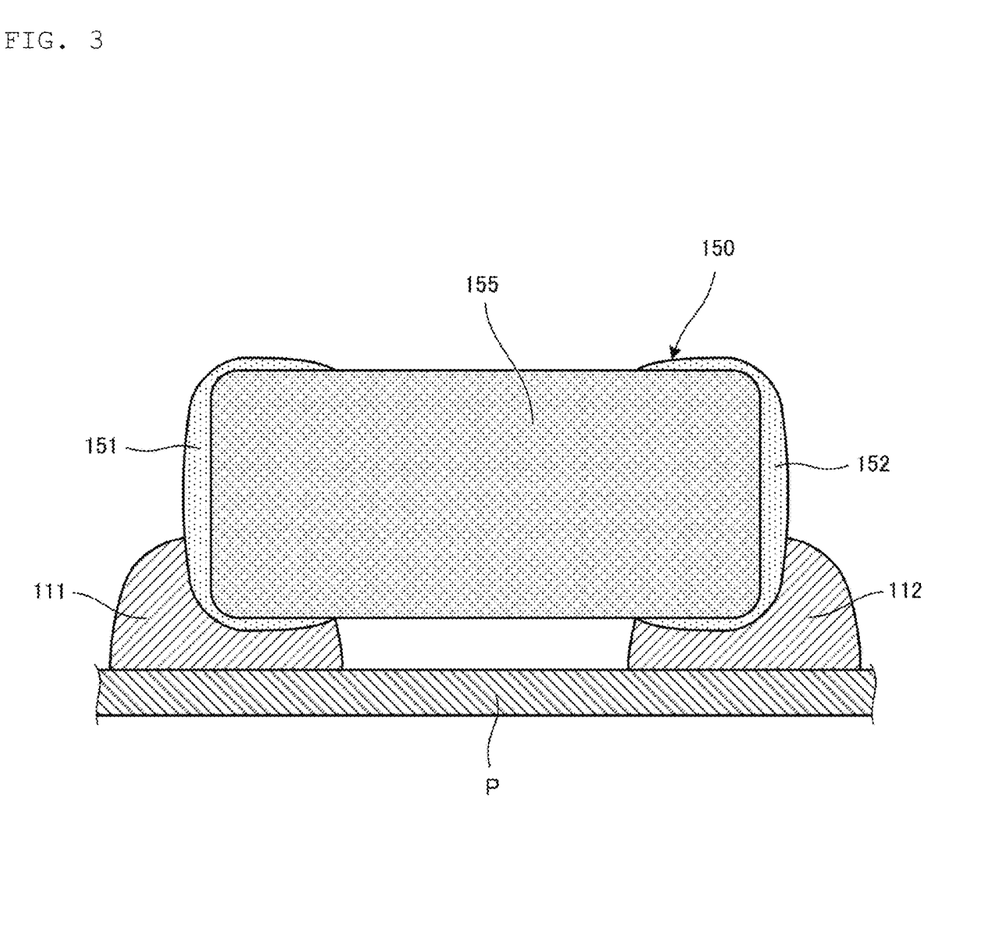
FIG. 3 is a cross-sectional view illustrating a capacitor mounted over a substrate with a metal paste interposed therebetween in an experiment.

FIG. 3 is a cross-sectional view illustrating a capacitor mounted over a substrate with a metal paste interposed therebetween in the present experiment. FIG. 3 shows the preparation of one of the multiple samples shown in Tables 1 and 2.

The metal paste of the composition was applied to a substrate of 10 mm×50 mm in size and 0.2 mm in thickness with the use of a metal mask. For the substrate, a non-oxygen Cu substrate was used. The metal mask was 1.5 mm×1.5 mm in opening diameter, and 100 μm in thickness.

On the metal paste applied, a capacitor with external electrodes subjected to Ni plating and Sn plating was mounted, and then heated with the use of a reflow device. The capacitor of 1.6 mm×0.8 mm×0.8 mm in size was used.

It is to be noted that a capacitor 150 mounted on metal pastes 111, 112 applied to a substrate P is shown in FIG. 3. The capacitor 150 has a laminated body 155 formed by laminating a plurality of ceramic layers, and external electrodes 151, 152 provided on both ends of the laminated body 155.

After going through the heating step with the reflow device, the metal pastes turn into the samples 1 to 15, 51 to 57 that contain the intermetallic compound members. The intermetallic compound members bond the substrate and the capacitor.

In this regard, the conditions for heating with the reflow device in Table 1 were set to 240° C. to 300° C. for T1, 160° C. to 260° C. for T2, 90 sec for t1-a, 0 sec to 210 sec for t1-b, and 0 sec to 210 sec for t2. In addition, the conditions for heating with the reflow device in Table 2 were set to 260° C. for T1, 210° C. for T2, 60 sec to 90 sec for t1-a, 0 sec to 30 sec for t1-b, and 60 sec to 400 sec for t2.

In addition, the conditions for heating with the reflow device were set to 1.4 to 3.5° C./sec for the rate of temperature increase from 50° C. to T1, and 1.0 to 3.5° C./sec for the cooling rate of slow cooling from T1 to T2 in each case of Tables 1 and 2. In addition, the heating was carried out with the reflow device in a nitrogen atmosphere (an oxygen concentration of 1000 ppm or less) in each case of Tables 1 and 2.

<<Void Ratio Evaluation>>

Each sample was embedded in an epoxy resin, and a cross section of the bonded body was polished, and then observed with the use of a metallographical microscope. From a photograph of the cross section of the bonded body, the volume of voids was quantified at the cross section of the bonded part immediately below the external electrode of the capacitor. Then, the proportion of the volume of voids to the bonded body connected to the capacitor was evaluated as a void ratio.

In this regard, a case of the void ratio from 0 to 10% was evaluated as ☉ (excellent), a case of the ratio of greater than 10% and 20% or less was evaluated as ○ (pass), and a case of the ratio of more than 20% was evaluated as x (fail).

Figure 4:
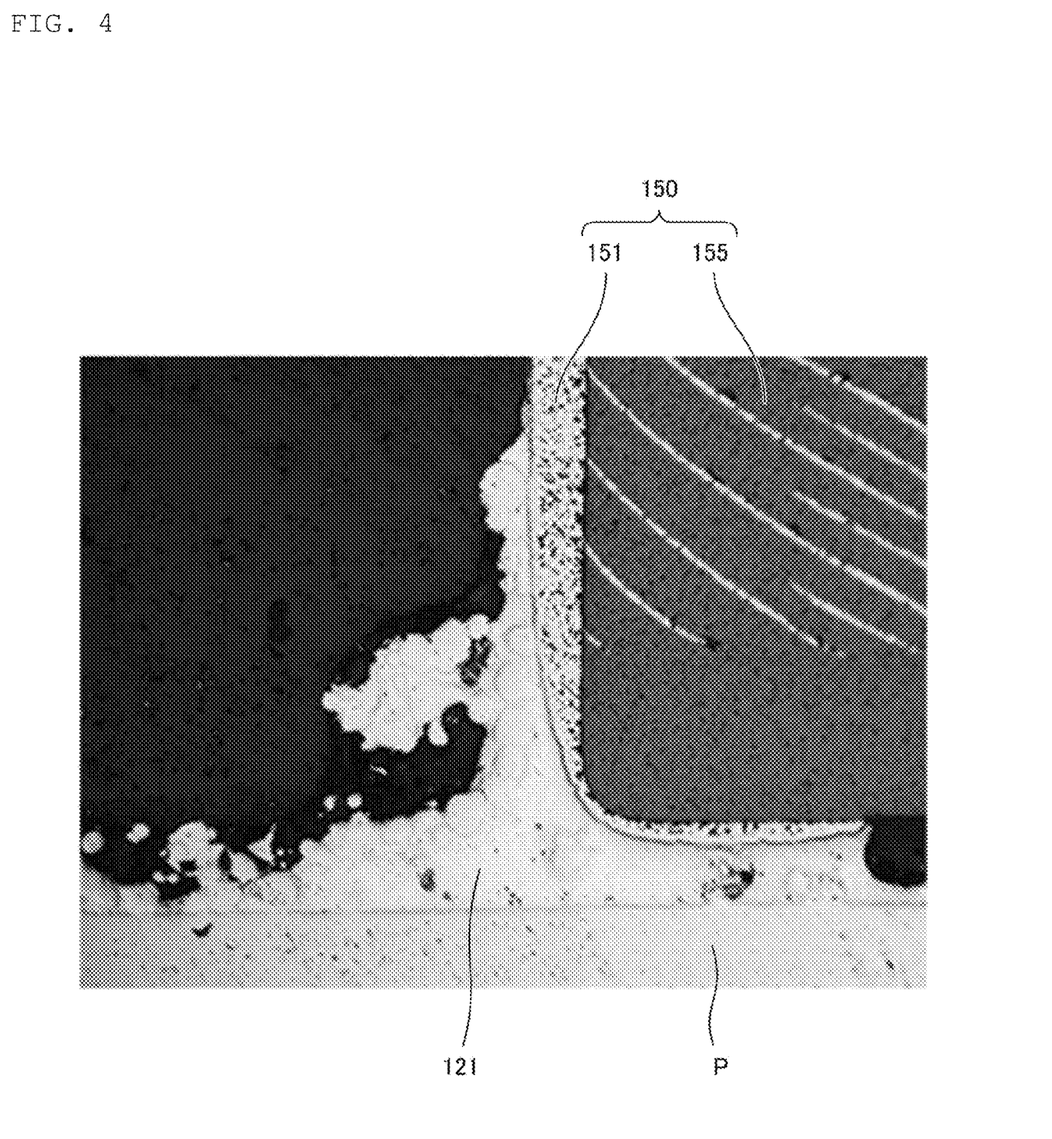
FIG. 4 is an enlarged cross-sectional view showing a bonded part between a capacitor product and a substrate, after going through the heating step in accordance with the temperature profile shown in FIG. 2.
Figure 5:
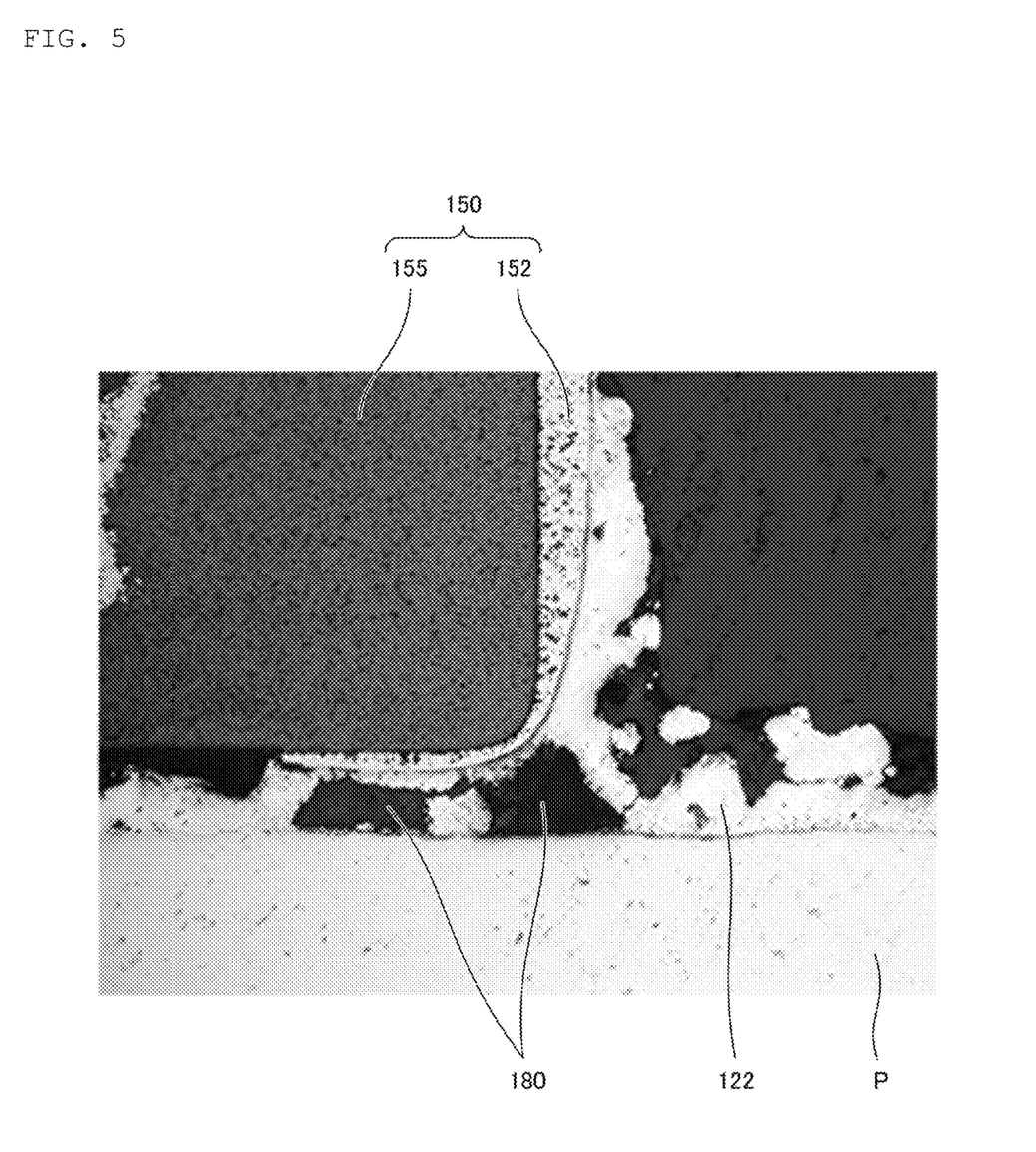
FIG. 5 is an enlarged cross-sectional view showing a bonded part between a capacitor and a substrate, after going through a heating step in accordance with a temperature profile according to a comparative example for an embodiment of the present invention.

FIG. 4 is an enlarged cross-sectional view showing a bonded part between a capacitor 150 and a substrate P, after going through the heating step in accordance with the temperature profile shown in FIG. 2. FIG. 5 is an enlarged cross-sectional view showing a bonded part between a capacitor 150 and a substrate P, after going through a heating step in accordance with a temperature profile according to a comparative example for the embodiment of the present invention.

In this regard, FIG. 4 shows a photograph of the sample 3 among the multiple samples shown in Tables 1 and 2. FIG. 5 shows a photograph of the sample 54 among the multiple samples shown in Tables 1 and 2.

In FIG. 4, a dense intermetallic compound member 121 including almost no voids is shown. In FIG. 5, an intermetallic compound member 122 including a large volume of voids 180 is shown.

<<Remaining Component Evaluation>>

From the intermetallic compound member as a reaction product, approximately 10 mg was cut out, and subjected to differential scanning calorimetry (DSC) under the conditions of measurement temperature: 30° C. to 300° C., rate of temperature increase: 5° C./min, $N_2$ atmosphere, and reference: $Al_2O_3$.

The amount of the remaining first metal Sn constituent was quantified from the heat absorption amount of a melting endothermic peak at the melting temperature of the first metal Sn constituent in the obtained DSC chart. Then, the proportion of the first metal Sn constituent to the total metal component was, as the remaining component ratio of the first metal, evaluated.

In this regard, a case of the remaining component ratio of the first metal from 0 to 10 volume % was evaluated as ⊙ (excellent), a case of the ratio of greater than 10 volume % and 20 volume % or less was evaluated as ○ (pass), and a case of the ratio of more than 20 volume % was evaluated as x (fail).

<<Comprehensive Determination>>

The comprehensive determination was made from the void ratio evaluation and the remaining component evaluation. In this regard, a case where the void ratio evaluation and the remaining component evaluation were both determined as ⊙ was evaluated as ⊙ (excellent). A case where either one of the void ratio evaluation or the remaining component evaluation was determined as ⊙, whereas the other was determined as ○ was evaluated as ○ (good). A case where either one of the void ratio evaluation or the remaining component evaluation was determined as x was evaluated as x (fail).

From the experiment, in the case of the samples 51 to 53, it has become clear that the first metal Sn remains in large amounts as shown in Table 1.

The first reason of this result is believed to be because the first metal Sn failed to melt or flow sufficiently due to the low temperature T1 for the samples 51, 52, thereby failing to wet the second metal CuNi alloy. In addition, the second reason of this result is believed to be because the reaction for the production of the intermetallic compound between the first metal and the second metal failed to proceed sufficiently due to the low temperature T2 for the samples 51, 53.

Next, from the experiment, in the case of the sample 54, it has become clear that a large volume of voids is generated as shown in Table 1. The reason of this result is believed to be because a large amount of gas was generated by the thermal decomposition of the flux component (rosin, activator) in the metal paste, due to long t1.

On the other hand, in the case of the multiple samples 1 to 8, it has become clear that the diffusion reactions proceeded properly, thereby producing intermetallic compound members as shown in Table 1.

The reason of this result is believed to be because the first metal Sn succeeded in melting and flowing sufficiently because of the high temperature T1, whereas there was almost no gas generated by the thermal decomposition of the flux component (rosin, activator) in the metal paste because of the temperature T2 in a preferred range, thereby causing the reaction for the production of the intermetallic compound between the first metal and the second metal to proceed sufficiently.

It is to be noted that when the temperature T1 is higher than 300° C., that is, when the temperature T1 is excessively high, the thermal decomposition of the flux component (rosin, activator) in the metal paste generates a large amount of gas, while the production of an intermetallic compound also proceeds at the same time. The generated gas is thus believed to fail to get out of the bonded body, thereby generating voids.

Next, from the experiment, in the case of the samples 55, 56, it has become clear that the first metal Sn remains in large amounts as shown in Table 2. The reason of this result is believed to be because the reaction between the first metal and the second metal failed to proceed sufficiently due to short t2.

Next, from the experiment, in the case of the sample 57, it has become clear that a large volume of voids is generated as shown in Table 2. The reason of this result is believed to be because a large amount of gas was generated by the thermal decomposition of the flux component (rosin, activator) in the metal paste, due to long t1.

On the other hand, in the case of the multiple samples 9 to 15, it has become clear that the diffusion reactions proceeded properly, thereby producing intermetallic compound members as shown in Table 2.

The reason of this result is believed to be because there was almost no gas generated by the thermal decomposition of the flux component (rosin, activator) in the metal paste due to t1 in the preferred range, whereas the reaction for the production of the intermetallic compound between the first metal and the second metal proceeded sufficiently due to long t2.

It is to be noted that when t1 is shorter than 60 seconds, that is, when t1 is excessively short, the first metal Sn is believed to fail to melt or flow sufficiently, thereby causing the first metal Sn to remain in large amounts.

In addition, while the reaction for the production of the intermetallic compound desirably proceeds more sufficiently as t2 is longer, t2 more preferably falls within the range of 120 seconds or longer and shorter than 400 seconds in consideration of production capacity and production efficiency.

From the foregoing, it has become clear that T1, T2, t1, and t2 preferably fall within the following ranges. More specifically, it has become clear that the temperature T1 preferably falls within the range of 250° C. or higher and 300° C. or lower, the temperature T2 preferably falls within the range of 180° C. or higher and 230° C. or lower, the time t1 preferably falls within the range of 60 seconds or longer and shorter than 120 seconds, and the time t2 preferably falls within the range of 120 seconds or longer and shorter than 400 seconds.

It has become clear that the temperature T2 is more preferably a temperature of 200° C. or higher and 230° C. or lower.

Accordingly, the production method according to the present embodiment can produce dense and highly heat-resistant intermetallic compounds.

Other Embodiments

It is to be noted that the metal paste 105 corresponding to the mixture according to the present invention has the form of a paste in the present embodiment, but not to be considered limited thereto. In practice, the mixture may have the form of, for example, a sheet-like solid or a putty.

In addition, the material for the first metal powder 106 is the single element Sn in the present embodiment, but not to be considered limited thereto. In practice, the material for the first metal powder 106 may be an alloy containing Sn (specifically, an alloy containing Sn and at least one selected from the group consisting of Cu, Ni, Ag, Au, Sb, Zn, Bi, In, Ge, Al, Co, Mn, Fe, Cr, Mg, Mn, Pd, Si, Sr, Te, and P).

In addition, the material for the second metal powder 107 is the CuNi alloy in the present embodiment, but not to be considered limited thereto. In practice, the material for the second metal powder 107 may be, for example, one or more types of powders selected from the group consisting of CuNi alloys, CuMn alloys, CuAl alloys, CuCr alloys, AgPd alloys, and the like.

In this regard, in the case of utilizing a solid-phase diffusion reaction, heat treatment conditions (temperature and time) may be set which are appropriate for the materials.

In addition, in the heating step according to the embodiment described above, far-infrared heating or high-frequency induction heating may be carried out, besides the hot-air heating. Furthermore, a chip may be heated while applying a pressure to the chip from above with the use of a jig.

Finally, the descriptions of the embodiments should be considered by way of example in all respects, but non-limiting. The scope of the present invention is not defined by the embodiments described above, but by the claims. Furthermore, the scope of the present invention is intended to encompass all modifications within the spirit and scope equivalent to the claims.

DESCRIPTION OF REFERENCE SYMBOLS

100: bonded structure
101: first object to be bonded
102: second object to be bonded
104: bonding material
105: metal paste
106: first metal powder
107: second metal powder
108: flux
109: intermetallic compound phase
110: metal component
111, 112: metal paste
121, 122: intermetallic compound member
150: capacitor
151: external electrode
155: laminated body
180: void
P: substrate

The invention claimed is:

1. A method for producing an intermetallic compound, the method comprising:
heating a mixture comprising a Sn powder, a CuNi alloy powder, and a flux component including a rosin and an activator, for a time t1 to a temperature T1 in a range of 250° C. to 300° C. to melt the Sn powder; and
after heating the mixture to the temperature T1, reducing the temperature T1 to a temperature T2 in a range of 180° C. to 230° C. within a time t2 that is longer than the time t1, and continually reducing the temperature T2 within the time t2 to produce an intermetallic compound from the Sn powder and the CuNi alloy
wherein the intermetallic compound has a void ratio of 20% or less; and
wherein the time t1 falls within a range of 60 seconds to 90 seconds, and the time t2 falls within a range of 120 seconds to 210 seconds.

2. The method for producing an intermetallic compound according to claim 1, wherein the Sn powder includes an alloy powder comprising Sn.

3. The method for producing an intermetallic compound according to claim 1, wherein the temperature T2 falls within a range of 200° C. to 230° C.

4. The method for producing an intermetallic compound according to claim 1, wherein the rosin includes at least one of a rosin-based resin and a synthetic resin.

5. The method for producing an intermetallic compound according to claim 1, wherein the activator is selected from a group consisting of a hydrohalogenic acid salt of an amine, an organic halogen compound, an organic acid, an organic amine, and a polyalcohol.

6. The method for producing an intermetallic compound according to claim 1, wherein the flux component further comprises at least one solvent selected from a group consisting of an alcohol, a ketone, an ester, an ether, an aromatic, and a hydrocarbon.

7. The method for producing an intermetallic compound according to claim 1, wherein the intermetallic compound has a void ratio of 10% or less.

8. The method for producing an intermetallic compound according to claim 1, wherein the mixture comprises 4 parts by weight of the rosin, and 2 parts by weight of the activator.

9. The method for producing an intermetallic compound according to claim 1, wherein the intermetallic compound has a void ratio of 5% or less.

10. The method for producing an intermetallic compound according to claim 1, wherein the activator is adipic acid.

* * * * *